United States Patent
Guziak

(10) Patent No.: US 10,677,846 B2
(45) Date of Patent: Jun. 9, 2020

(54) ELECTRONIC SWITCH

(71) Applicant: HYDRA-ELECTRIC COMPANY, Burbank, CA (US)

(72) Inventor: Robert Andrew Guziak, Thousand Oaks, CA (US)

(73) Assignee: HYDRA-ELECTRIC COMPANY, Burbank, CA (US)

( * ) Notice: Subject to any disclaimer, the term of this patent is extended or adjusted under 35 U.S.C. 154(b) by 214 days.

(21) Appl. No.: 15/579,147

(22) PCT Filed: Jun. 3, 2016

(86) PCT No.: PCT/US2016/035899
§ 371 (c)(1),
(2) Date: Dec. 1, 2017

(87) PCT Pub. No.: WO2016/197052
PCT Pub. Date: Dec. 8, 2016

(65) Prior Publication Data
US 2018/0172766 A1    Jun. 21, 2018

Related U.S. Application Data

(60) Provisional application No. 62/171,178, filed on Jun. 4, 2015.

(51) Int. Cl.
*G01R 31/327* (2006.01)
*H01H 9/54* (2006.01)
(Continued)

(52) U.S. Cl.
CPC ......... *G01R 31/327* (2013.01); *G01R 27/205* (2013.01); *G01R 31/3278* (2013.01); *H01H 9/167* (2013.01); *H01H 9/542* (2013.01); *H03K 17/302* (2013.01); *H01H 1/0015* (2013.01); *H01H 35/24* (2013.01); *H01H 2009/546* (2013.01); *H02M 2001/0045* (2013.01); *H03K 17/60* (2013.01)

(58) Field of Classification Search
CPC ...... G01R 31/327; G01R 31/00; H01H 9/167; H01H 9/542; H01H 35/24; H01H 1/0015; H01H 2009/546; H03K 17/302; H03K 17/60; H02M 2001/0045
See application file for complete search history.

(56) References Cited

U.S. PATENT DOCUMENTS

2004/0012376 A1    1/2004   Taghizadeh-Kaschani
2006/0212745 A1    9/2006   Zansky et al.
(Continued)

OTHER PUBLICATIONS

International Search Report and Written Opinion for Serial No. PCT/US16/35889 dated Aug. 30, 2016.

*Primary Examiner* — Christopher P McAndrew
*Assistant Examiner* — Zannatul Ferdous
(74) *Attorney, Agent, or Firm* — Brooks Acordia IP Law, PC; Michael Zarrabian

(57) ABSTRACT

A device, including: a sensor circuit that senses the state of contact impedance of a mechanical electrical switch; and a switch-off circuit that represents a sensed high impedance contact of the switch as a low or constant impedance, where the sensor circuit detects an open or closed condition of the switch by sensing a voltage across the switch passing a threshold value.

20 Claims, 4 Drawing Sheets

(51) Int. Cl.
*H03K 17/30* (2006.01)
*H01H 9/16* (2006.01)
*G01R 27/20* (2006.01)
H03K 17/60 (2006.01)
H01H 1/00 (2006.01)
H01H 35/24 (2006.01)
H02M 1/00 (2006.01)

(56) References Cited

U.S. PATENT DOCUMENTS

2014/0265556 A1 9/2014 Rubio et al.
2016/0169945 A1* 6/2016 Mauder .............. G01R 31/3274
  324/126

* cited by examiner

ELECTRONIC SWITCH

CROSS-REFERENCE TO RELATED APPLICATION

This application is a U.S. National Phase Patent Application under 35 U.S.C. § 371 of International Application Number PCT/US2016/035899 filed Jun. 3, 2016, which claims the priority benefit of U.S. Provisional Patent Application Ser. No. 62/171,178, filed Jun. 4, 2015, both of which are incorporated herein by reference in their entirety for all purposes.

TECHNICAL FIELD

The present disclosure relates to electronic switches, and more particularly to electronic switches coupled to mechanical switches.

BACKGROUND

A mechanical switch provides a metal closure that closes or opens an electrical contact. Relays and mechanical Micro-switches use a contact closure, which typically engages a gold over nickel interface plated copper contact.

SUMMARY

An exemplary device embodiment may include: a sensor circuit that may sense the state of contact impedance of a mechanical electrical switch; and a switch-off circuit that may represent a sensed high impedance contact of the switch as a low or constant impedance. In additional exemplary device embodiments, the switch-off circuit may output a sensed high impedance contact of the switch as a low or constant impedance to an external circuit. In additional exemplary device embodiments, the sensor circuit may sense the state of contact impedance of the switch when the switch is open or closed. In additional exemplary device embodiments, the sensor circuit may include a gain device to sense the state of the contact impedance of the switch. In additional exemplary device embodiments, the gain device may be biased to sense the state of the contact impedance of the switch indicated as an On condition with the switch is open.

In additional exemplary device embodiments, the switch-off circuit may include a gain device that reduces the apparent contact resistance of the switch to an external circuit by a gain factor of the gain device. In additional exemplary device embodiments, the gain device may include a transistor device with a current gain such that the contact impedance of the switch appears lower than the sensed actual contact impedance of the switch. In additional exemplary device embodiments, the device may include a resistor in series with the collector of the transistor device, where the On or Off state of the transistor device, in relation to the sensed contact impedance of the switch, may be indicated to an external circuit as a closed or open switch, respectively. In additional exemplary device embodiments, the gain device may include a transistor device with high gain, high Off impedance, and low On resistance.

In additional exemplary device embodiments, the sensor circuit may sense a voltage, such that a sensed voltage higher than a threshold represents a first state, and a sensed voltage lower than the threshold represents a second state. In additional exemplary device embodiments, the switch-off circuit may represent the detected state into an impedance change high or low, that causes an output detection circuit (19) to be loaded or unloaded with respect to higher current draw or lower, respectively.

In additional exemplary device embodiments, the sensor circuit may detect an open or closed condition of the switch by sensing a voltage across the switch passing a threshold value, wherein higher than the threshold value indicates a first state of the switch and lower than the threshold value indicates a second state of the switch; and the switch-off circuit may represent the detected first state and second state of the switch into an impedance change of high and low, respectively, whereby the output detection circuit may be loaded or unloaded based on the said impedance change of high or low, corresponding to higher or lower current draw via the electrical switch, respectively. Additional exemplary device embodiments may include a filter device that reduces the effects of contact bounce in electrical signals from the mechanical switch.

An exemplary switching device embodiment may include a detection circuit that may sense the open or closed state of a mechanical switch; and a switch-off circuit that may represent the sensed open or closed state of the mechanical switch as a constant or low impedance indication, independent of the mechanical switch contact impedance. In additional exemplary switching device embodiments, the detection circuit may sense the state of contact impedance of the switch; and the switch-off circuit may represent a sensed high impedance contact of the switch as a low or constant impedance.

In additional exemplary switching device embodiments, the sensor circuit may include a gain device to sense the state of the contact impedance of the switch, such that the gain device is biased to sense the state of the contact impedance of the switch indicated as an On condition with the switch is open. In additional exemplary switching device embodiments, the switch-off circuit may include a gain device that reduces the apparent contact resistance of the switch to an external circuit by a gain factor of the gain device. In additional exemplary switching device embodiments, the gain device may include a transistor device with a current gain such that the contact impedance of the switch appears lower than the sensed actual contact impedance of the switch.

An exemplary switch circuit embodiment may include a detection circuit that may sense contact impedance of a mechanical switch for open or closed states of the mechanical switch; and a switch-off module that may compensate for variations in sensed contact impedance of the mechanical switch, whereby the switching circuit. In additional exemplary switch circuit embodiments, the switching circuit may compensate for variations in sensed contact impedance of the mechanical switch due to conditions including one or more: wear-out, contact damage, contact contamination and manufacturing variations in contact impedance.

This brief summary has been provided so that the nature of this disclosure may be understood quickly. A more complete understanding of the disclosure can be obtained by reference to the following detailed description of the various aspects thereof in connection with the attached drawings.

BRIEF DESCRIPTION OF THE DRAWINGS

The foregoing features and other features will now be described with reference to the drawings of various aspects. In the drawings, the same components have the same reference numerals. The illustrated aspects are intended to illustrate, but not to limit the present disclosure. The drawings include the following Figures.

DETAILED DESCRIPTION

Figure 1:
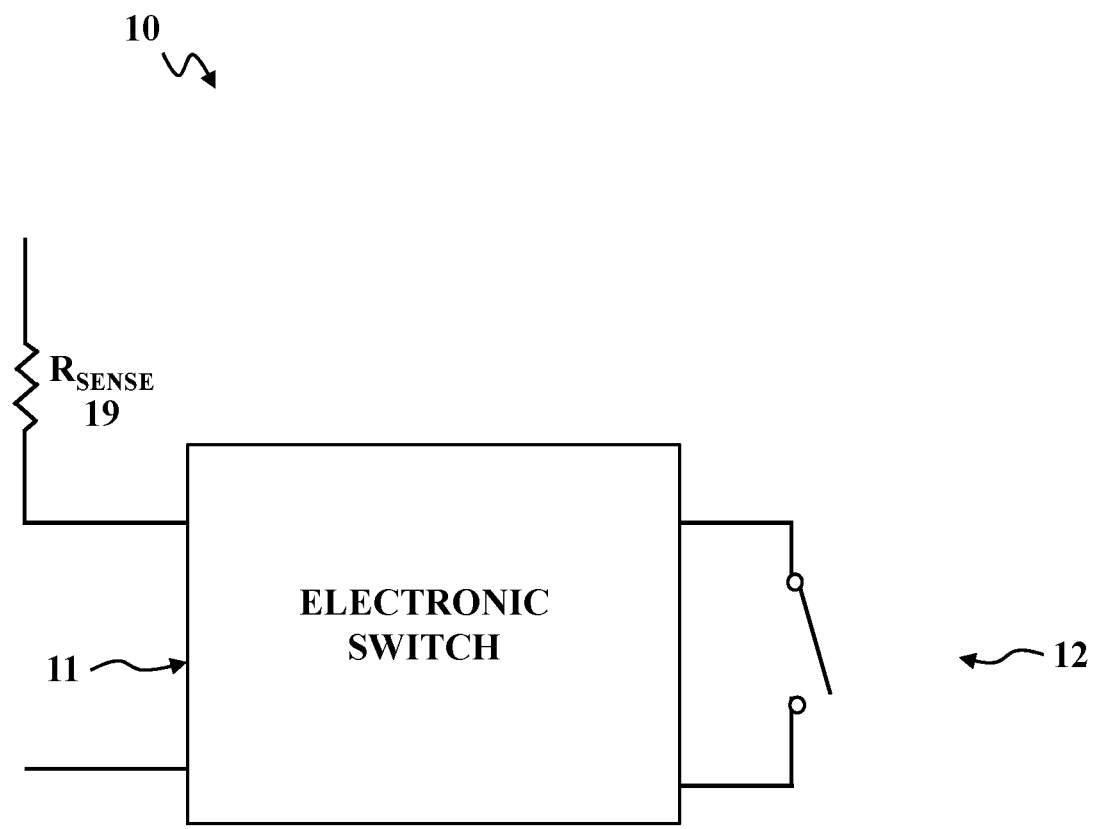
FIG. 1 shows a block diagram of a circuit that includes an electronic switch device disclosed herein, as coupled to a mechanical switch.

The description herein is made for the purpose of illustrating the general principles of the embodiments discloses herein and is not meant to limit the concepts disclosed herein. Further, particular features described herein can be used in combination with other described features in each of the various possible combinations and permutations. Unless otherwise specifically defined herein, all terms are to be given their broadest possible interpretation including meanings implied from the description as well as meanings understood by those skilled in the art and/or as defined in dictionaries, treatises, etc.

A mechanical electrical switch (or mechanical switch) provides a metal contact closure that closes or opens an electrical contact. Mechanical switches such as relays and mechanical micro-switches use a contact closure, which typically engages a gold over nickel interface plated copper contact.

In one application, disclosed herein, mechanical switches and micro-switches are used in pressure switches. A pressure switch is a switch that closes an electrical metal contact when a set pressure has been reached on its input. The pressure switch may be designed to make contact either on pressure rise or on pressure fall.

A conventional mechanical switch is susceptible to failure from contact wear, galling and fretting, contact welding, and/or contact contamination. Specifically, conventional mechanical switches and micro-switches, such as used in pressure switches, have several distinct and catastrophic (to the application) failure mechanisms. A symptom of such a failure is for a closed mechanical switch to appear as a high impedance open. The intent of the mechanical switch as used in a pressure switch sensor is to provide an indication of the presence or absence of a given level of pressure. A failed closed mechanical switch may appear as a high impedance open, which may not provide an intended indication when paired with a pressure switch. A high impedance closed contact does not provide the intended indication of the measured pressure.

Contact wear may occur when the electrical contact, typically gold, wears after repeated open-closed cycles. The metal contact wears exposing the metal underneath. This base metal is typically nickel or copper both of which oxidize when exposed to air, and form high impedance barriers.

Galling and fretting or the rubbing wear of the gold may occur due to thermal expansion/contraction, vibration or acoustic action. This has the same effect as the contact wear.

Contact welding may occur with a current flow during a closed switch condition, on opening the connection, the current continues to flow until interrupted. The interruption will cause an arc or spark leading to metal welding. This also occurs during contact bounce on closure. The arc causes metal to heat and weld. The weld operation causes metal to be pulled and broken apart, forming rough surface interconnects. This leads to either contact wear or high current density at point contacts. The result is high impedance.

Contact contamination may occur through accretion, condensation, adsorption or mechanical deposition. Various non-conduction compounds (e.g., solder flux, outgassed contaminants, molded plastic flash, dust, etc.) may become located in the contact area. These materials can cause a high impedance condition.

Embodiments of an electronic switch are disclosed herein, wherein in one embodiment the electronic switch is capable of being coupled to a mechanical switch to address the aforementioned shortcomings.

In one embodiment, the electronic switch comprises a switch device that closes or opens an external electrical circuit in response to closing or opening of a mechanical switch, allowing current to flow through the external electrical circuit when the switch device is closed, and prevents or reduces current flow through the external electrical circuit when the switch device is open. The disclosed electronic switch "repeats", or buffers, a mechanical switch contact and keeps a constant impedance for most of the life of the mechanical switch.

In one embodiment, the disclosed electronic switch can therefore be used in high-vibration environments and extends the life expectancy of a mechanical switch by two to twenty times, or more.

Embodiments of the electronic switch disclosed herein may be optimized for current flow, open impedance (High), closed impedance (Low), contact bounce (short or few bounces) and number of contact closure-opening cycles. The electronic switch disclosed herein also allows for activation through an outside control signal of mechanical switch.

FIG. 1 shows a block diagram of an electronic switch 11 as a switch device disclosed herein, connected in an overall electrical circuit 10 that includes a mechanical switch 12 such as a pressure switch to be sensed via the electronic switch 11.

In one embodiment, the electronic switch 11 disclosed herein comprises an electronic switch circuit including active electronics with a current gain to sense the contact state (i.e., open or closed) of the mechanical switch 12 that is electrically coupled to the electronic switch 11.

Using the gain, a high impedance mechanical contact of the mechanical switch 12 is made to appear to an external circuit 19 (external to the electronic switch 11 and the mechanical switch 12) by the electronic switch 11 as a low or constant impedance, essentially independent of contact wear in the mechanical switch. The result is to increase the useful life of the mechanical switch to at least a significant factor of its normal life of the mechanical switch, such as two to twenty times. In the example embodiment shown in the drawings, the external circuit 19 is represented by a resistor $R_{SENSE}$.

In one embodiment, the electronic switch 11 operates as a two-wire circuit, appearing as a purely mechanical switch would. No outside power or power connection is required. In the simplest implementation, the electronic switch 11 appears a single pole single throw switch.

Figure 2:
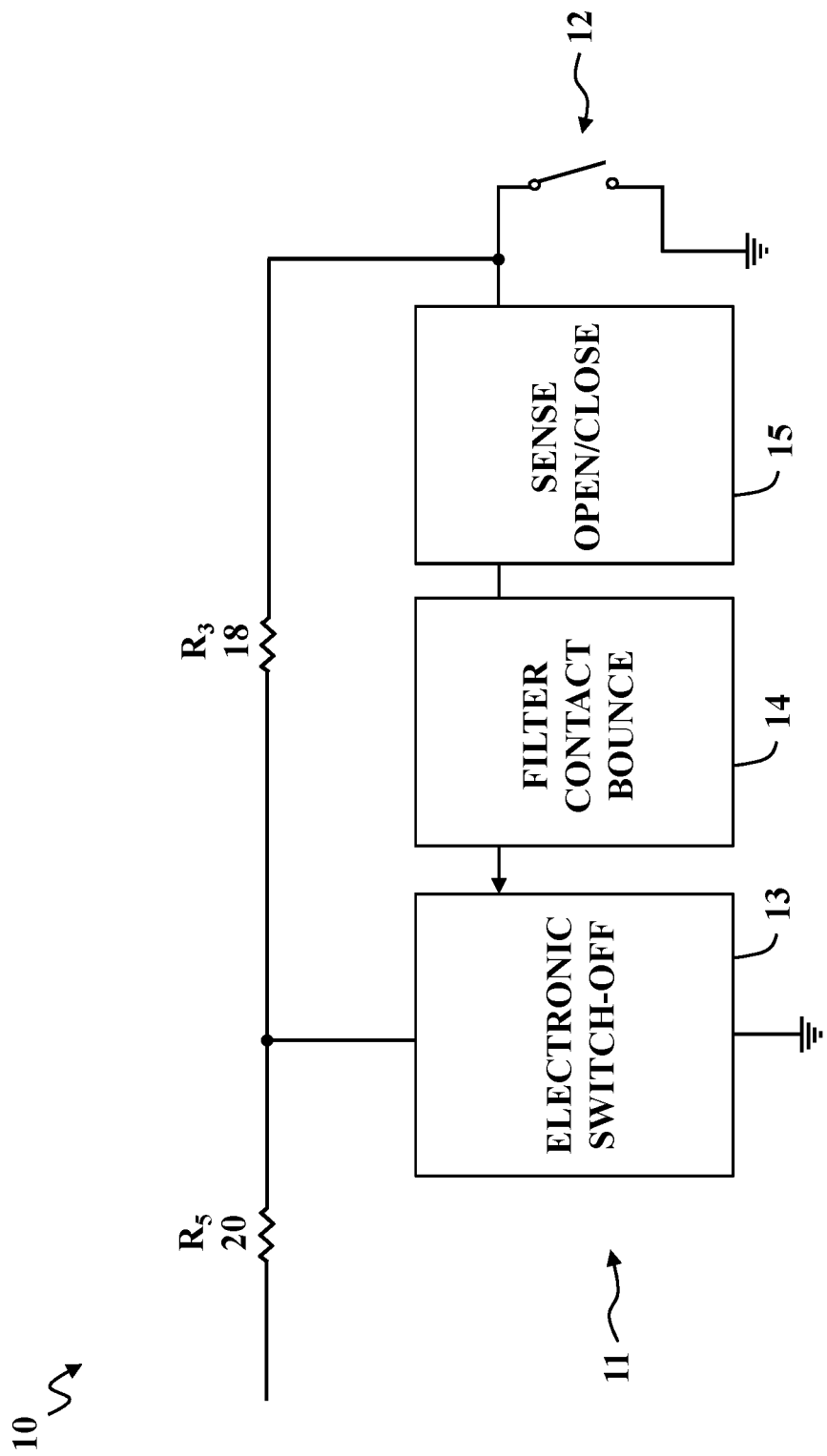
FIG. 2 shows a block diagram of the circuit of FIG. 1 showing the components of the electronic switch device disclosed herein, as coupled to the mechanical switch to be sensed.

FIG. 2 shows a functional block diagram of a portion of the circuit 10 of FIG. 1. showing the components of an embodiment of the electronic switch 11 disclosed herein, as coupled to the mechanical switch 12 to be sensed.

In this embodiment, the electronic switch 11 includes an electronic switch off module 13, a filter contact bounce module 14 reduces the effects of, or eliminates, contact bounce from the mechanical switch 12 and a sense open/close module 15 that senses if the mechanical switch 12 is open or closed.

The sense module (device) 15 comprises a detection circuit allowing detection of an open or closed condition (state) of the mechanical switch 12 by causing an electronic circuit (such as a transistor, comparator, or operational amplifier), to sense a voltage that passes a threshold value. Higher than the threshold value is a first detected state of the mechanical switch, and lower than the threshold value is a second detected state of the mechanical switch. The switch-off module (device) 13 allows converting the detected state into an impedance change of high or low, that causes the external circuit 19 (i.e., output detection circuit) to be loaded or unloaded with respect to higher or lower current draw via the mechanical switch 12.

One embodiment disclosed herein comprises a switching circuit 11 which includes: (1) a detection (sensor) device that senses the open or closed state of the mechanical switch, and (2) a switch-off device that in response to the sensed state of the switch, outputs a constant or low impedance indication independent of the mechanical switch contact impedance.

One embodiment disclosed herein comprises a switching circuit including: (1) a detection device 15 that senses the open or closed state of the mechanical switch 12, and (2) a compensating circuit 13 that compensates for mechanical switch wear-out, contact damage, contact contamination and manufacturing variations in contact impedance of the mechanical switch 12.

One embodiment of the circuit 11 comprises a sensor circuit 15 that senses the state of contact impedance of a mechanical switch 12, as an on condition when the mechanical switch is open, and an off condition when the mechanical switch is closed. The circuit 11 further comprises a switch-off circuit 13 that converts a sensed high impedance contact of the mechanical switch to an external circuit as a low or constant impedance.

One embodiment of the circuit 11 comprises a sensor circuit 15 that detects an open or closed condition of a mechanical switch 12 by sensing a voltage across the mechanical electrical switch 12 passing a threshold value, wherein higher than the threshold indicates one state of the mechanical switch 12 and lower than the threshold value indicates a second state of the mechanical switch 12. The circuit 11 further includes a switch-off circuit 13 that represents the detected first state and second state of the mechanical switch as an impedance change of high and low, respectively. As such, the output detection circuit (e.g., $R_{SENSE}$ voltage measure) is loaded or unloaded based on the said impedance change of high or low, corresponding to higher or lower current draw via the electrical switch 12, respectively.

Figure 3:
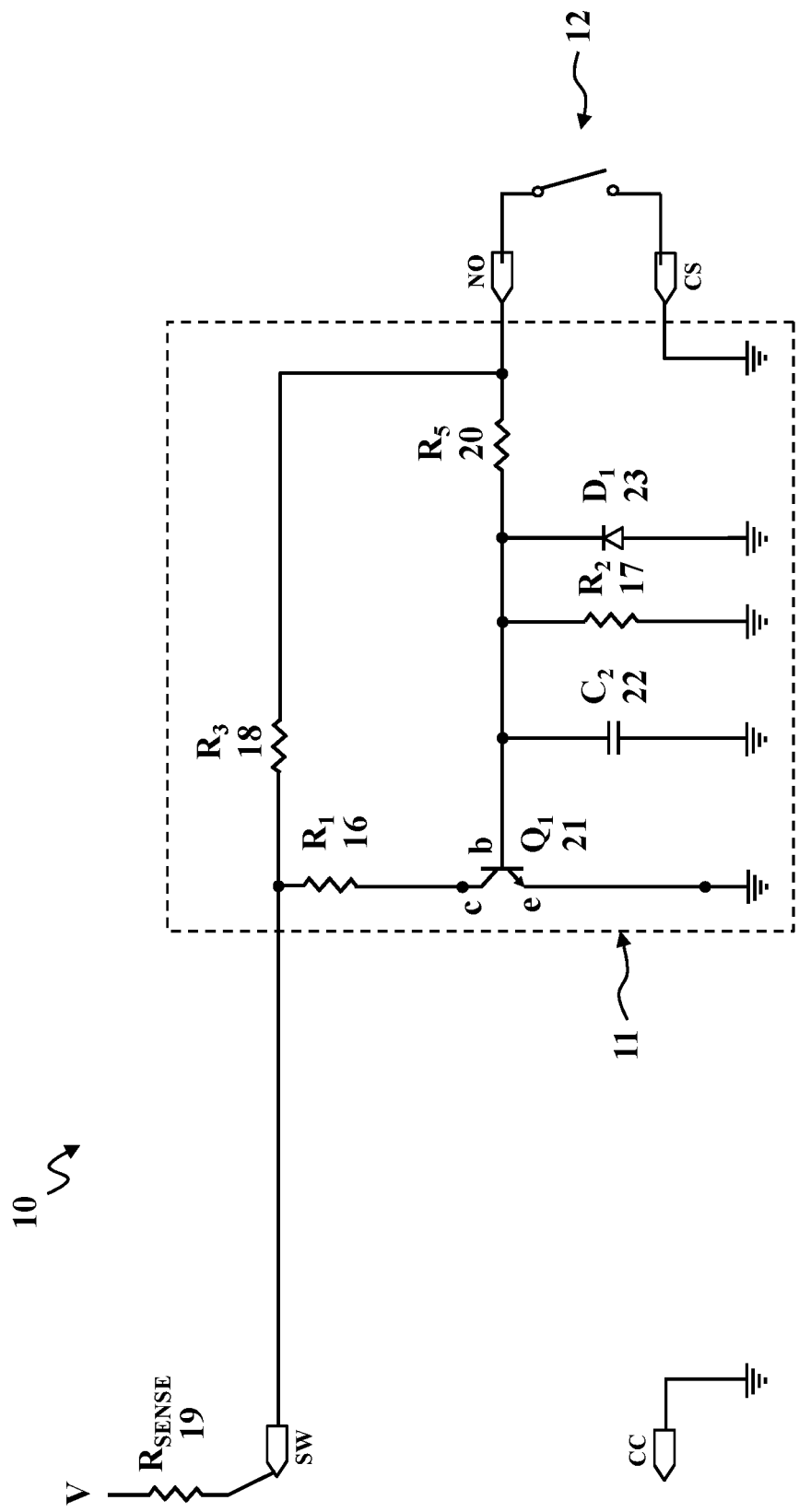
FIG. 3 shows a schematic diagram of the circuit of FIG. 1 that includes an embodiment of the electronic switch device disclosed herein, as coupled to the mechanical switch to be sensed.

FIG. 3 shows a schematic diagram of an implementation of the circuit 10 of FIG. 1 that includes an embodiment of the electronic switch 11 disclosed herein, as coupled to the mechanical switch 12. The implementation is one possible circuit of many that can be implemented to perform the function of the electronic switch 11.

In this embodiment, the electronic switch 11 comprises an electronic component with a current gain to sense the contact state (i.e., open or closed) of the mechanical switch 12. Using the gain, a high impedance mechanical contact of the mechanical switch 12 can be made to appear to an external circuit (external to the electronic switch device and the mechanical switch, which in FIG. 3 may be as seen at the $R_{SENSE}$ 19 external to the switch device 11) as a low or constant impedance, essentially independent of contact wear in the mechanical switch 12.

In one embodiment, the switch-off module 13 of the electronic switch 11 comprises an electronic circuit comprising a transistor with high gain (e.g., greater than about 100), high Off impedance (e.g., about 10 times greater than an On condition of the transistor), and low On resistance (e.g., typically about 10 to 500 Ohms).

In one implementation, the electronic switch-off module 13 comprises a current gain device 21 (e.g., bipolar transistor $Q_1$ type BC847CTP) and resistor 16 (e.g., a resistor $R_1$), wherein the resistor $R_1$ is connected in series with collector c of the transistor 21. In another embodiment, electronic switch off module 13, the device 21 may comprise a high-reliability, no wear out electronic switch. The electronic device can also comprise a comparator, operational amplifier, etc.

In the embodiment shown in FIG. 3, the device 21 puts a constant, low impedance between external circuit 19 and a power return (i.e., between SW and CC positions).

The filter contact bounce module 14 may be optional in the electronic switch device 11. The filter contact bounce module 14 may include a capacitor 22 (e.g., capacitor $C_2$) and a resistor 20 (e.g., resistor $R_5$), connected in series as shown. The contact bounce module 14 reduces the effects of, or eliminates, contact bounce from the mechanical switch 12 as there may be some bouncing in the contacts of mechanical switch due to vibration. The contact bounce module 14 filters out the signals via the mechanical switch 12 that are due to bounce.

In one implementation, the sense open/close module 15 includes said device 21 for sensing said contact impedance condition/state of the mechanical switch 12, as described. In some embodiments, the device 21 may comprise an electronic switch of some kind, such as a transistor, general amplifier, electronic sensor, etc. This module 15 senses if the mechanical switch 12 is open or closed.

In the implementation the electronic switch 11 shown in FIG. 3, the base terminal of the transistor device 21 is biased, via a voltage supplied, to sense the state of the mechanical switch 12 contact impedance to appear as an On condition with the mechanical switch 12 open, and Off condition with the mechanical switch 12 closed.

Generally, a transistor device conducts current across the collector c to emitter e path, only when a voltage is applied to the base b (i.e., transistor device is On). When no base voltage is present, the transistor device functions as a switch that is Off. When base voltage is present, the transistor device functions as a switch that is On. In another example, a transistor device conducts current across the collector c to emitter e path, only when a voltage above a threshold is applied to the base b (i.e., transistor device is On). When the base voltage is less than the threshold, the transistor device functions as a switch that is Off. When the base voltage is above the threshold, the transistor device functions as a switch that is On.

When the mechanical switch 12 is closed, the voltage at the base terminal of the transistor device 21 is taken below a turn-on threshold voltage, causing the transistor device 21 to turn off, wherein the transistor device 21 does not conduct current across the collector-emitter path. By selecting the resistance value of the resistor 16 in series with the collector of the transistor device 21 of the electronic switch 11 the On or Off state of the transistor device 21, is controlled with logical inverse to the closed or open position of the mechanical switch 12. The sensed state can be made to appear to an external circuit (e.g., $R_{SENSE}$ 19) as a closed or open mechanical switch 12, respectively.

As such, the On or Off state of the transistor device 21 in relation to the sensed contact impedance of the switch 12, appears to an external circuit as a closed or open mechanical switch 12, respectively. In one example, an Off state of transistor device 21 corresponds to the closed state of the mechanical switch 12, and an On state of the transistor device 21 corresponds to the open state of the mechanical switch 12, essentially independent of the contact wear, galling, fretting, contact welding, and/or contact contamination, in the mechanical switch 12.

Other logical conditions may be configured. For example, the electronic switch 11 may be mechanically coupled in the normally open or the normally closed state to reverse the sense logic. Further, in FIG. 3, the switch 12 connection may be from the NO connection, replacing $R_3$. This reverses the operational logic of the electronic switch 11 to On with switch 12 closure, and Off with switch 12 open.

In one example, in normally open condition of the mechanical switch 12, external voltage of about 28 Volts through resistor 19 causes voltage at the base of transistor 21 to be pulled high to cause 0.7 Volt drop across transistor 21 (collector of transistor 21 is at about 0.2 Volts). This cases the transistor 21 to turn On, whereby current flows through collector-emitter path of the transistor 21. This causes the voltage across $R_{SENSE}$ to be high (e.g., about 24 Volts) and the voltage from SW to CC to be about 4 Volts or less.

When the mechanical switch 12 is closed, the voltage at base of the transistor 21 is about 0 Volts which turns the transistor 21 Off, and there is open circuit voltage across the transistor 21. The voltage drop across the resistor 18 is a high voltage determined by the resistor divider formed by resistor 18 and $R_{SENSE}$, typically about 8 Volts or higher. Voltage from SW to CC is typically about 8 Volts or higher.

As such, the sensed voltage between SW to CC is low (e.g., typically 4 Volts) or lower when the mechanical switch 12 is open (transistor 21 is On), and high (e.g., greater than about 8 Volts) when the mechanical switch 12 is closed (transistor 21 is Off).

The electronic switch 11 senses the voltage across the mechanical switch 12 and produces a corresponding voltage at resistor 19 which is controlled by the mechanical switch 12 being open (On) and closed (Off). This allows tailoring the electronic switch 11 for a mechanical switch 12 that has a high impedance (high contact resistance) and normally indicates a false open state for the mechanical switch 12. Coupling the electronic switch 11 between the mechanical switch 12 and the external circuit 19, eliminates effects of the false open state of mechanical switch 12 on the external circuit 19 by a gain factor of the transistor 21.

In FIG. 3, in one example the value of resistor 19 ($R_{SENSE}$) is about 100K Ohms and the value of the voltage V is about 28 Volts. The value of the resistor 18 ($R_3$) is about 140K Ohm. The value of the resistor 16 ($R_1$) is about 470 Ohm at ½ watt. The value of the resistor 20 ($R_5$) is about 1 ohm. The value of the resistor 17 ($R_2$) is about 1M Ohm. The value of capacitor 22 ($C_2$) is about at 0.022 microfarad. The diode 23 ($D_1$) provides a reverse polarity protection by clamping any negative voltage spike to approximately −0.7 volt.

The resistor $R_1$ is connected in series with the collector c of the transistor 21. The resistor $R_5$ is connected in series between the base b of the transistor 21 and a terminal (NO) of the mechanical switch 12. The capacitor $C_2$, the resistor $R_1$, and diode $D_1$, are connected in parallel between the base b of the transistor 21 and ground. The resistor $R_3$ is connected between: (1) a first terminal of the resistor $R_1$ (and resistor $R_{SENSE}$), and a (2) first terminal of the $R_5$ (and to the switch 12).

The function of the current gain at the transistor device 21 of the electronic switch 11 (e.g., on the order of about 100 or higher), is to reduce the apparent contact resistance of the mechanical switch 12 by that gain factor. As such, in one example leveraging the current gain at the transistor device 21, the contact impedance of the mechanical switch 12 can be made to be, e.g., about 100 times lower than the actual impedance of the mechanical switch 12.

Further, the voltage and current switched by the mechanical switch 12 is isolated from the external circuit 19 through the electronic switch 11 using a high resistance element 18 (e.g., resistor $R_3$) as a current limiter. This reduces the effects of welding in the mechanical switch 12. Resistor 18 limits the current that goes to the mechanical switch 12 through the electronic switch 11, which diminishes or decreases the welding contact that can occur.

In one embodiment, the circuit 10 disclosed herein incorporates the action in a pressure switch which uses only a two-wire configuration. In one embodiment, the electronic switch 11 can be implemented on a physical circuit board with electronic components added to the mechanical switch structure. The topology of the electronic switch 11 inverts the mechanical switch action in the basic form, as described. The components of the electronic switch 11 can include additional features such as contact bounce elimination by filtering in the optional module 14, as described. The electronic switch 11 functions as a repeater that isolates the mechanical switch 12 from a full current load and voltage extremes of the external circuit which can damage the mechanical switch 12. This reduces the effects of welding.

In one embodiment, the disclosed electronic separates the impedance of the mechanical switch 12 (e.g., micro-switch) through transistor 21 from the sensed impedance 16. This reduces the effects of increased impedance from galling, contact wear, fretting and welding on the mechanical micro-switch 12. The micro-switch 12 voltage and current load are reduced using the electronic switch 11, essentially eliminating welding effects and prolonging actual life of the micro-switch 12.

The disclosed electronic switch 11 operates with no additional power, and the useable life of the micro-switch 12 is extended. False failures due to high impedance or contact bounce are reduced. The micro-switch 12 impedance characteristics can be predicted for the entire life of operation of the micro-switch 12.

The applications of electronic switch 11 are for any mechanical switch application where wear, galling, fretting, weld damage or increasing contact impedance are issues. A focus for the example application described herein is in micro-switch 12 impedance sensing for pressure switches. A secondary application is applicability to temperature switches based on actuation of a micro-switch.

Figure 4:
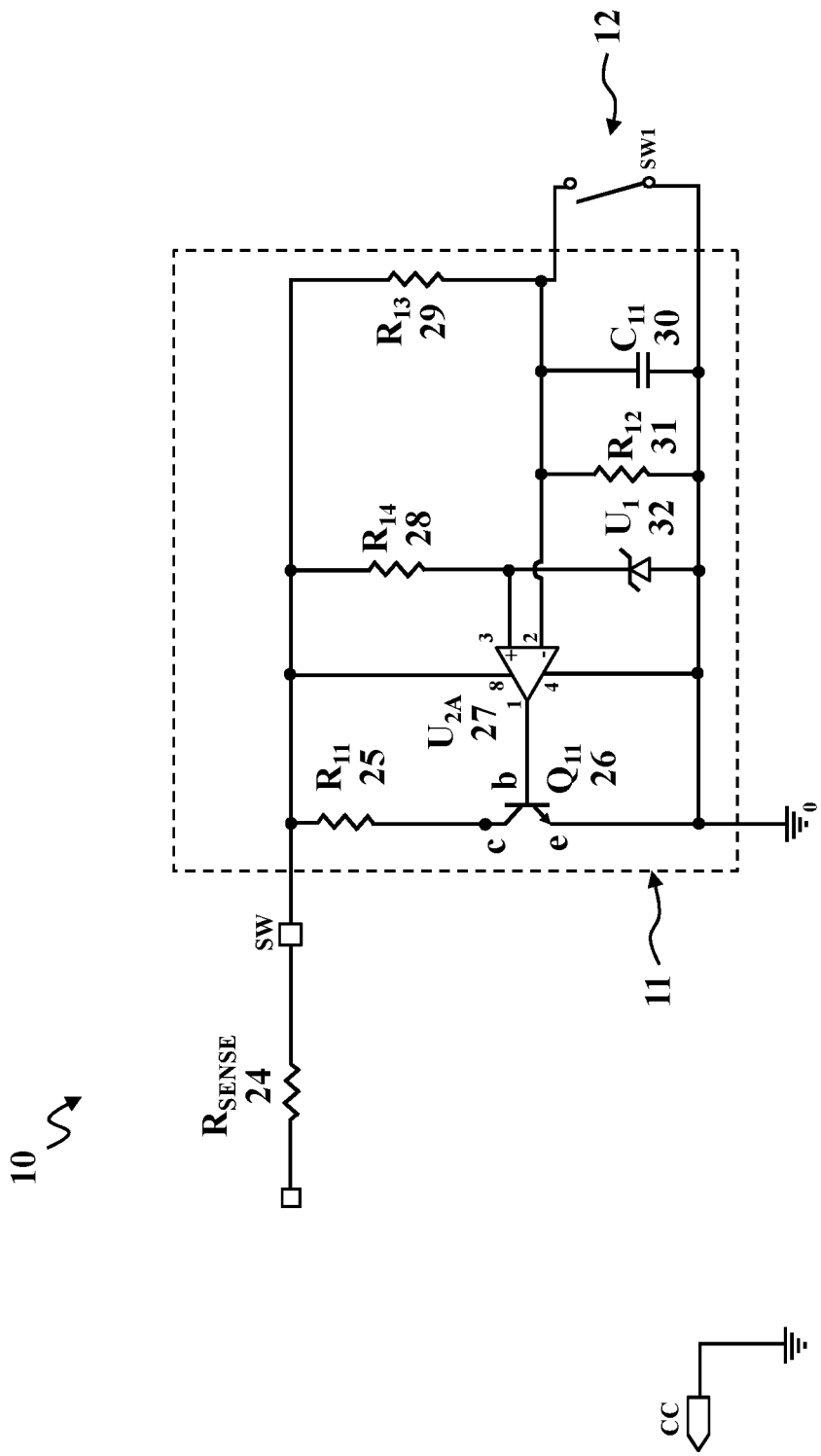
FIG. 4 shows a schematic diagram of an alternate circuit of FIG. 1 that includes an embodiment of the electronic switch device disclosed herein, as coupled to the mechanical switch to be sensed.

FIG. 4 shows a schematic diagram of an alternate circuit implementation of the block diagram in FIG. 1, that includes another embodiment of the electronic switch device 11 disclosed herein as a switch circuit 111, as coupled to the mechanical switch 12 to be sensed. This switch circuit 111 is similar in function to the circuit 11 in FIG. 3 using a transistor unit. In the circuit 111 the component 27 ($U_2$) comprises a comparator that senses a threshold voltage (similar to the transistor 21 in FIG. 3).

In the switch circuit 11, the capacitor 30 and the resistor 31 form a contact bounce filter as in the transistor circuit in FIG. 3. The diode 32 provides a reference threshold voltage, the resistor 25 provides sense current to the mechanical switch 12. The resistor 28 provides voltage drive for the voltage reference diode 32.

Referring to FIG. 4, when the switch 12 (SW1) is open, the voltage at Pin 2 of the comparator 27 is high. This causes the output of the comparator 27 at Pin 1 to switch low at the base of the transistor 26 ($Q_1$), whereby the transistor 26 turns off and the voltage drop at external circuit 24 (e.g., $R_{SENSE}$) is low, making the node SW at the $R_{SENSE}$ 24 a high voltage. When the switch 12 is closed, the voltage at input Pin 2 of the comparator 27 drops below the voltage reference at input Pin 3 of the comparator 27 connected to diode 32 ($U_1$), causing the output voltage at Pin 1 of the comparator 27 to switch high. This raises the voltage at the base of the transistor 26 to high, wherein the transistor 26 turns on. This causes the voltage drop across $R_{SENSE}$ 24 to be large, bringing the SW point low. This voltage change provides the external means of detecting the state of the mechanical switch.

The resistor 31, capacitor 30 are connected in parallel with the switch 12 and the input Pin 2 of the comparator 27. The resistor 25 is connected in series between the collector of the switching transistor 26 and the external circuit 24. The resistor 28 is connected in series between the external circuit 24 and second input Pin 3 of the comparator 27. The resistor 29 is connected in series between the switch 12 and the external circuit 24.

In the example circuit 11 of FIG. 1, the resistor 25 ($R_{11}$) is about 330 Ohms, the resistor 28 ($R_{14}$) is about 100K Ohm.

The values for the electronic and electrical components (along with voltage/current values) in FIGS. 3-4 and described herein are for example purposes only, and the disclosed electronic switch is not limited to these examples.

A device 11 embodiment may include a sensor circuit 15 that senses the state of contact impedance of a mechanical electrical switch 12; and a switch-off circuit 13 that represents a sensed high impedance contact of the switch as a low or constant impedance. The switch-off circuit 13 may output a sensed high impedance contact of the switch as a low or constant impedance to an external circuit. The sensor circuit 15 may sense the state of contact impedance of the switch 12 when the switch is open or closed. The sensor circuit 15 may include a gain device 21 to sense the state of the contact impedance of the switch. The gain device 21 may be biased to sense the state of the contact impedance of the switch indicated as an On condition with the switch is open. The switch-off circuit 13 may include a gain device 21 that reduces the apparent contact resistance of the switch to an external circuit by a gain factor of the gain device.

The gain device 21 may include a transistor device with a current gain such that the contact impedance of the switch appears lower than the sensed actual contact impedance of the switch. The device may further include a resistor in series with the collector of the transistor device 21, where the On or Off state of the transistor device 21, in relation to the sensed contact impedance of the switch, may be indicated to an external circuit 19 as a closed or open switch, respectively. The gain device 21 may include a transistor device with high gain, high Off impedance, and low On resistance. The sensor circuit 15 may sense a voltage, such that a sensed voltage higher than a threshold represents a first state, and a sensed voltage lower than the threshold represents a second state. The switch-off circuit 13 may represent the detected state into an impedance change high or low, that causes an output detection circuit 19 to be loaded or unloaded with respect to higher current draw or lower, respectively.

The sensor circuit 15 may detect an open or closed condition of the switch 12 by sensing a voltage across the switch passing a threshold value, where higher than the threshold value indicates a first state of the switch and lower than the threshold value indicates a second state of the switch 12; and the switch-off circuit 13 may represent the detected first state and second state of the switch 12 into an impedance change of high and low, respectively, whereby the output detection circuit 19 may be loaded or unloaded based on the said impedance change of high or low, corresponding to higher or lower current draw via the electrical switch 12, respectively. The device may further include a filter device 14 that reduces the effects of contact bounce in electrical signals from the mechanical switch.

A switching device 11 embodiment may include: a detection circuit 15 that may sense the open or closed state of a mechanical switch 12; and a switch-off circuit 13 that may represent the sensed open or closed state of the mechanical switch as a constant or low impedance indication, independent of the mechanical switch contact impedance. The detection circuit 15 may sense the state of contact impedance of the switch 12; and the switch-off circuit 13 may represent a sensed high impedance contact of the switch as a low or constant impedance. The sensor circuit 15 may include a gain device 21 to sense the state of the contact impedance of the switch, such that the gain device 21 is biased to sense the state of the contact impedance of the switch indicated as an On condition with the switch is open. The switch-off circuit 13 may include a gain device 21 that reduces the apparent contact resistance of the switch to an external circuit by a gain factor of the gain device. The gain device 21 may include a transistor device with a current gain such that the contact impedance of the switch appears lower than the sensed actual contact impedance of the switch.

A switching circuit 11 embodiment may include: a detection circuit 15 that may sense contact impedance of a mechanical switch 12 for open or closed states of the mechanical switch; and a switch-off module 13 that may compensate for variations in sensed contact impedance of the mechanical switch 12, whereby the switching circuit 11. The switching circuit may compensate for variations in sensed contact impedance of the mechanical switch 12 due to conditions including one or more: wear-out, contact damage, contact contamination and manufacturing variations in contact impedance.

Those skilled in the art will appreciate that various adaptations and modifications of the described preferred embodiments can be configured without departing from the scope and spirit of the electronic switch device described herein. Therefore, it is to be understood that, within the scope of the embodiments, the electronic switch device may be practiced other than as specifically described herein.

What is claimed is:

1. A device, comprising:
    a sensor circuit that senses the state of contact impedance of a mechanical electrical switch; and
    a switch-off circuit that converts the detected state into an impedance value and represents a sensed high impedance contact of the switch as a low or constant impedance.

2. The device of claim 1, wherein:
    the switch-off circuit outputs a sensed high impedance contact of the switch as a low or constant impedance to an external circuit.

3. The device of claim 2, wherein:
the sensor circuit senses the state of contact impedance of the switch when the switch is open or closed.

4. The device of claim 3, wherein:
the sensor circuit comprises a gain device to sense the state of the contact impedance of the switch.

5. The device of claim 4, wherein:
the gain device is biased to sense the state of the contact impedance of the switch indicated as an On condition with the switch is open.

6. The device of claim 3, wherein:
the switch-off circuit comprises a gain device that reduces the apparent contact resistance of the switch to an external circuit by a gain factor of the gain device.

7. The device of claim 6, wherein:
the gain device comprises a transistor device with a current gain such that the contact impedance of the switch appears lower than the sensed actual contact impedance of the switch.

8. The device of claim 6, further comprising:
a resistor in series with the collector of the transistor device, wherein the On or Off state of the transistor device, in relation to the sensed contact impedance of the switch, is indicated to an external circuit as a closed or open switch, respectively.

9. The device of claim 8, wherein the gain device comprises a transistor device with high gain, high Off impedance, and low On resistance.

10. The device of claim 3, wherein:
the sensor circuit senses a voltage, such that a sensed voltage higher than a threshold represents a first state, and a sensed voltage lower than the threshold represents a second state.

11. The device of claim 10, wherein the switch-off circuit represents the detected state into an impedance change high or low, that causes an output detection circuit to be loaded or unloaded with respect to higher current draw or lower, respectively.

12. The device claim 1, wherein:
the sensor circuit detects an open or closed condition of the switch by sensing a voltage across the switch passing a threshold value, wherein higher than the threshold value indicates a first state of the switch and lower than the threshold value indicates a second state of the switch; and
the switch-off circuit represent the detected first state and second state of the switch into an impedance change of high and low, respectively, whereby the output detection circuit is loaded or unloaded based on the said impedance change of high or low, corresponding to higher or lower current draw via the electrical switch, respectively.

13. The device of claim 1, further comprising a filter device that reduces the effects of contact bounce in electrical signals from the mechanical switch.

14. A switching device, comprising:
a detection circuit that senses the open or closed state of a mechanical switch; and
a switch-off circuit that converts the detected state into an impedance change and represents the sensed open or closed state of the mechanical switch as a constant or low impedance indication, independent of the mechanical switch contact impedance.

15. The switching device of claim 14, wherein
the detection circuit senses the state of contact impedance of the switch; and
the switch-off circuit represents a sensed high impedance contact of the switch as a low or constant impedance.

16. The switching device of claim 15, wherein:
the sensor circuit comprises a gain device to sense the state of the contact impedance of the switch, such that the gain device is biased to sense the state of the contact impedance of the switch indicated as an On condition with the switch is open.

17. The switching device of claim 14, wherein:
the switch-off circuit comprises a gain device that reduces the apparent contact resistance of the switch to an external circuit by a gain factor of the gain device.

18. The switching device of claim 17, wherein:
the gain device comprises a transistor device with a current gain such that the contact impedance of the switch appears lower than the sensed actual contact impedance of the switch.

19. A switching circuit, comprising:
a detection circuit that senses contact impedance of a mechanical switch for open or closed states of the mechanical switch; and
a switch-off module that converts the detected state into an impedance value and compensates for variations in sensed contact impedance of the mechanical switch.

20. The switching circuit of claim 19, wherein the switching circuit corrects for variations in sensed contact impedance of the mechanical switch due to conditions including one or more: wear-out, contact damage, contact contamination and manufacturing variations in contact impedance.

* * * * *